United States Patent
Beck et al.

(10) Patent No.: US 10,141,734 B2
(45) Date of Patent: Nov. 27, 2018

(54) ELECTRICAL SAFETY DEVICE MISWIRE DETECTION

(71) Applicant: SEMICONDUCTOR COMPONENTS INDUSTRIES, LLC, Phoenix, AZ (US)

(72) Inventors: Riley D. Beck, Eagle Mountain, UT (US); Kent D. Layton, Lehi, UT (US); Scott R. Grange, Pleasant Grove, UT (US); Rishi Pratap Singh, Provo, UT (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 131 days.

(21) Appl. No.: 14/850,271

(22) Filed: Sep. 10, 2015

(65) Prior Publication Data

US 2016/0118785 A1    Apr. 28, 2016

Related U.S. Application Data

(60) Provisional application No. 62/068,743, filed on Oct. 26, 2014.

(51) Int. Cl.
*H02H 3/44* (2006.01)
*G01R 19/165* (2006.01)
(Continued)

(52) U.S. Cl.
CPC .......... *H02H 3/44* (2013.01); *G01R 19/165* (2013.01); *H01H 83/04* (2013.01); *H01H 83/144* (2013.01); *H01H 2083/045* (2013.01)

(58) Field of Classification Search
CPC ............... H01H 83/04; H01H 83/144; H01H 2083/045; H01H 50/08; H01H 75/00;
(Continued)

(56) References Cited

U.S. PATENT DOCUMENTS

| 4,031,431 A | 6/1977 | Gross | |
|---|---|---|---|
| 4,045,822 A * | 8/1977 | Schade, Jr. | ............ H02H 3/021 327/429 |

(Continued)

FOREIGN PATENT DOCUMENTS

| EP | 3012853 | 4/2016 |
|---|---|---|
| WO | 2000074192 A1 | 12/2000 |

OTHER PUBLICATIONS

Fairchild Semiconductor RV4141A Low Power Ground Fault Interrupter—Product Specification.*
(Continued)

*Primary Examiner* — Thienvu Tran
*Assistant Examiner* — Nicolas Bellido
(74) *Attorney, Agent, or Firm* — Robert F. Hightower

(57) ABSTRACT

Aspects of an electrical safety device that provides detection of miswiring of line and load connection pairs are presented. In an example, the device includes a differential current detector through which are routed a live current path and a neutral current path coupling the line and load connection pairs. The device also includes a selectable conducting path that, when selected, circumvents the differential current detector while coupling one of a line live connection to a load live connection or a line neutral connection to a load neutral connection of the connection pairs. The device further includes a control circuit that determines, via the differential current detector, while the conducting path is selected, a differential current defined by a difference in currents on the live and neutral current paths, and interrupts at least one of the live and neutral current paths in response to the differential current not exceeding a threshold value.

18 Claims, 8 Drawing Sheets

(51) Int. Cl.
*H01H 83/04* (2006.01)
*H01H 83/14* (2006.01)

(58) Field of Classification Search
CPC .. H02H 3/44; H02H 3/28; H02H 3/00; H02H 3/14; H02H 1/0015; H02H 3/006; H02H 3/08; H02H 3/087; H02H 3/105; H02H 3/16; H02H 3/33; H02H 3/335; H02H 3/338; H02H 9/02; G01R 19/165; G01R 31/02; H01C 7/13; H02M 1/32; H03K 17/0822
USPC .................................. 361/42, 93.1
See application file for complete search history.

(56) References Cited

U.S. PATENT DOCUMENTS

| | | | |
|---|---|---|---|
| 5,224,006 A * | 6/1993 | MacKenzie | H02H 1/0015 361/45 |
| 5,420,740 A * | 5/1995 | MacKenzie | H02H 1/04 361/113 |
| 6,850,394 B2 | 2/2005 | Kim | |
| 7,253,629 B1 | 8/2007 | Richards et al. | |
| 7,586,718 B1 * | 9/2009 | Radosavljevic | H01H 83/04 361/42 |
| 7,643,257 B1 | 1/2010 | Morgan et al. | |
| 8,299,799 B2 | 10/2012 | Finlay, Sr. et al. | |
| 8,541,978 B2 * | 9/2013 | Fukuo | B60L 3/0069 320/109 |
| 2002/0054464 A1 | 5/2002 | Neiger et al. | |
| 2004/0027739 A1 | 2/2004 | Radosavljevic et al. | |
| 2005/0212522 A1 | 9/2005 | Finlay, Sr. et al. | |
| 2008/0106831 A1 * | 5/2008 | Lewinski | H02H 3/335 361/42 |
| 2008/0140354 A1 * | 6/2008 | Kolker | G01R 31/025 702/185 |
| 2010/0194354 A1 * | 8/2010 | Gotou | H02H 3/33 320/163 |
| 2013/0278361 A1 * | 10/2013 | Weeks | H05K 5/02 335/6 |

OTHER PUBLICATIONS

Leviton—Introducing the SmartlockPro® Self-Test GFCI.*
European Searching Authority, Extended European Search Report, issued in connection with EP Application No. 15191298.7, dated Mar. 8, 2016 (6 pages).

* cited by examiner

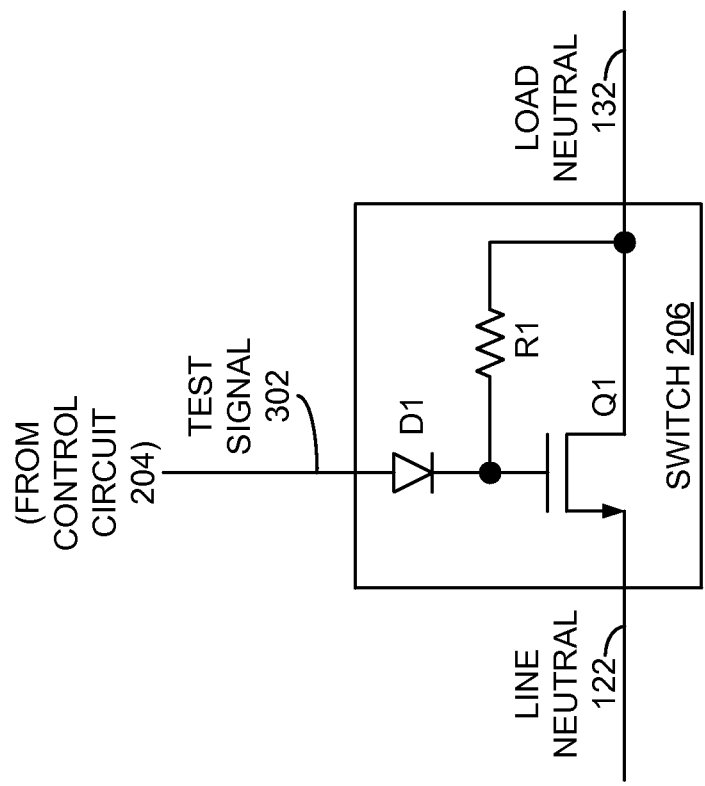

ELECTRICAL SAFETY DEVICE MISWIRE DETECTION

RELATED APPLICATION

This application claims the benefit of priority to U.S. Provisional Application No. 62/068,743, filed Oct. 26, 2014, and titled "Systems, Circuits, and Methods for Detection of Miswiring," the contents of which are hereby incorporated herein by reference in their entirety.

TECHNICAL FIELD

Aspects of the present disclosure relate generally to electrical circuits and, more specifically, to miswire detection for electrical safety devices.

BACKGROUND

For many years, ground fault circuit interrupters (GFCIs) have served an important function in the electrical power distribution system of private homes, businesses, and other structures in preventing users from experiencing an electrical shock under many circumstances. Typically, a GFCI is implemented within an electrical power receptacle and performs its function by disconnecting power at a receptacle connection pair of the receptacle in response to detecting small differences in current at the receptacle carried over a live or "hot" current path and a neutral current path that may be indicative of a "ground fault," in which at least some current is inadvertently being directed to ground from the live or neutral current path. Typically, such detection is performed using a current transformer through which the live and neutral paths are routed within the GFCI. In addition, the GFCI may also provide power to one or more additional receptacles on the same electrical power circuit.

To perform its function properly, a GFCI receptacle typically provides a line connection pair for live and neutral wires received from a circuit breaker of an electrical panel, and also provides a load connection pair for live and neutral wires for one or more additional receptacles of the same electrical power circuit, in addition to the receptacle connection pair, so that the GFCI may disconnect both the receptacle connection pair and the load connection pair from the line connection pair.

Generally speaking, miswiring of the GFCI, in which the live and neutral wires from the circuit breaker panel are mistakenly coupled to the live and neutral lines of the load connection pair, and the live and neutral wires connected to the other power receptacles are connected to the line connection pair, is an all-too-common occurrence. In cases of such miswiring, most GFCIs are unable to detect a ground fault at the GFCI receptacle connection pair since the current transformer is not positioned between the load connection pair and the receptacle connection pair, and thus cannot detect the resulting difference in current in the live and neutral current paths at that point.

In addition, other electrical safety devices, such as, for example, arc fault circuit interrupters (AFCIs), may also be susceptible to a similar miswiring problem.

BRIEF DESCRIPTION OF THE DRAWINGS

Exemplary embodiments are illustrated in referenced figures of the drawings. It is intended that the embodiments and figures disclosed herein are to be considered illustrative rather than limiting. The use of the same reference numerals in different drawings indicates similar or identical items.

FIG. 3 is an example switch circuit employable as a selectable low-ohmic path in the GFCI of FIGS. 2A through 2D;

DETAILED DESCRIPTION

Figure 1:
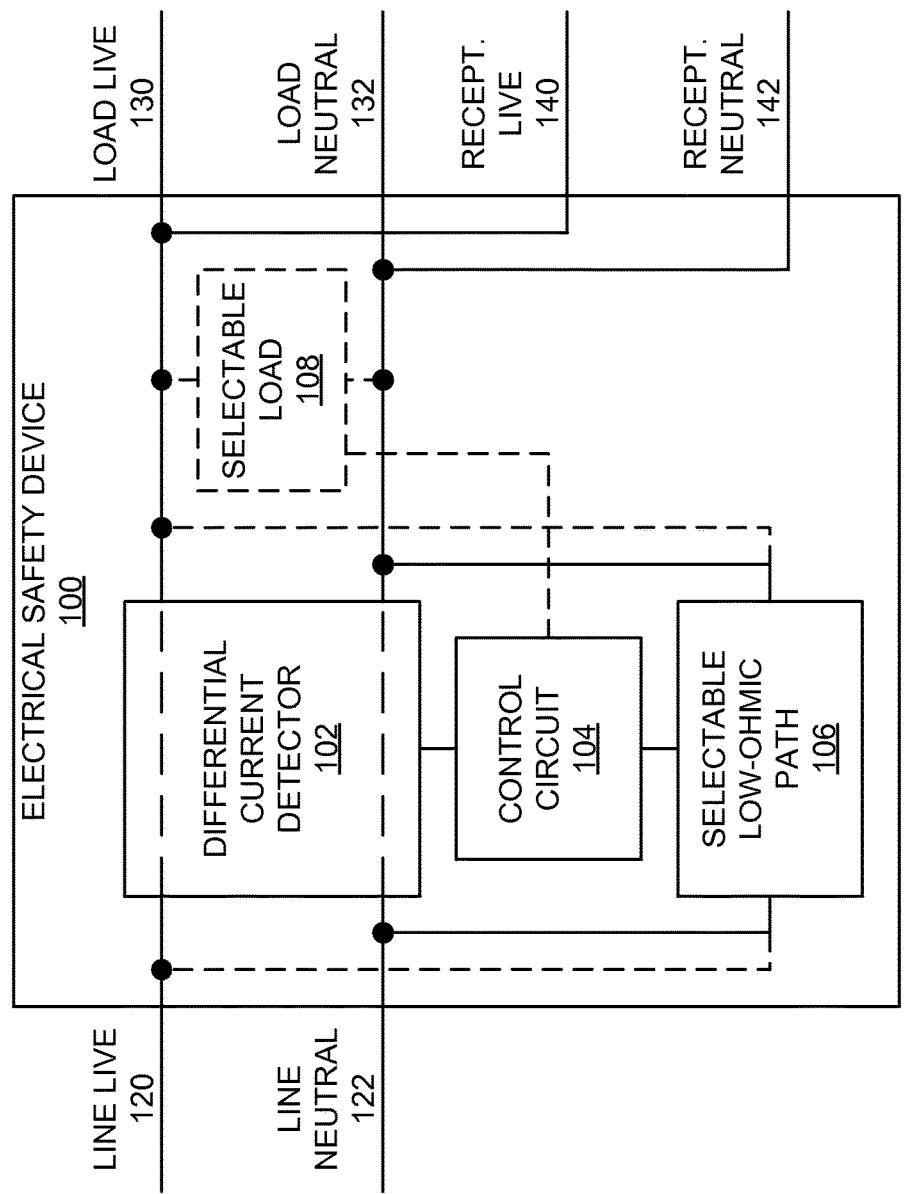
FIG. 1 is a block diagram of an example electrical safety device employing miswiring detection.

FIG. 1 is a block diagram of an example electrical safety device 100 employing miswire detection. The electrical safety device 100 may be any device configured to protect people or property in the event of some detected problem or anomaly in the electrical circuits or devices to which the electrical safety device 100 is connected or coupled. In some embodiments, at least some of which are described in greater detail below, the electrical safety device 100 may be a ground fault circuit interrupter (GFCI). However, several other types of electrical safety devices may serve as the electrical safety device 100 of FIG. 1, including, but not limited to, arc fault circuit interrupters (AFCIs), surge protection devices (SPDs), transient voltage surge suppressors (TVSSes), and so on, as well as combination devices, such as, for example, combined GFCI/AFCI devices. In each example, the electrical safety device 100 is configured to detect a miswiring of the electrical safety device 100 to the electrical circuit in which it is installed. For example, in many of the embodiments described herein, the electrical safety device 100 is configured to determine if the line and load connections of the electrical safety device 100 are miswired or cross-wired, which may prevent detection of one or more circuit problems that the electrical safety device 100 was intended to detect and/or mitigate. These and other potential advantages of the various embodiments disclosed below will be recognized from the discussion set out herein.

As depicted in FIG. 1, the electrical safety device 100 may provide a line connection pair 120, 122 including a line "hot" (or "live") connection 120 and a line neutral connection 122, and also provide a load connection pair 130, 132 including a load hot (or live) connection 130 and a load neutral connection 132. Generally, the line connection pair 120, 122 may be connected directly to a circuit breaker panel or similar power distribution point, while the load connection pair 130, 132 may be coupled to one or more power receptacles into which devices may be plugged to access electrical power. Further, each of the live or hot connections 120, 130 may carry an alternating current (AC) supply voltage that provides the electrical power to the devices consuming the power, while each of the neutral connections 122, 132 may carry the return current from the devices back to the supplier of the power, such as the circuit breaker panel. In addition, the electrical safety device 100 may provide a receptacle connection pair 140, 142 of a receptacle hot or live connection 140 and a receptacle neutral connection 142 so that one or more devices may access the electrical power directly from the electrical safety device 100 operating as a power receptacle. In other examples, the electrical safety device 100 may be installed in a location that is not readily accessible as a power receptacle, such as in a circuit breaker panel, and thus may not provide the receptacle connection pair 140, 142.

In at least some examples, the electrical safety device 100 may also provide a ground connection in conjunction with each of the line connection pair 120, 122, the load connection pair 130, 132, and the receptacle connection pair 140, 142, which may be coupled to a conductive chassis and/or other portions of the devices accessing power via the electrical safety device 100 or other power receptacles connected thereto. The ground connections are not discussed further below to simplify and focus the following discussion.

The electrical safety device 100, as illustrated in FIG. 1, may include a differential current detector 102, a control circuit 104, a selectable low-ohmic or low-resistance conducting path 106, and possibly a selectable load 108. The electrical safety device 100 may include other components, such as one or more resistors, capacitors, inductors, silicon-controlled rectifiers (SCRs), transistors, input buttons, output components (e.g., one or more light-emitting diodes (LEDs), sound generation devices, and/or the like), and/or so on to perform various functions other than miswire detection, but are not explicitly depicted in FIG. 1.

The differential current detector 102 may be configured to detect a difference in electrical current being carried by a live or hot current path (such as the path between the line live connection 120 and the load live connection 130) and a neutral current path (such as the path between the line neutral connection 122 and the load neutral connection 132). In the example of a GFCI, a significant difference between the electrical currents carried by the live current path and the neutral current path may be interpreted as an undesirable or dangerous redirecting of current outside of the power distribution system and the electrical devices being supplied with the power. As a result, the differential current detector 102 may be employed to perform a standard operation associated with the electrical safety device 100, such as ground fault detection, in addition to miswire detection, while the differential current detector 102 may be employed specifically for miswire detection in other examples. As is explained with respect to FIGS. 2A through 2D below, the differential current detector 102 may include a current transformer.

The selectable low-ohmic path 106 may be configured to provide, when selected or activated, an additional current path coupling the line neutral connection 122 and the load neutral connection 132 while circumventing the differential current detector 102 to carry at least a portion of the current that otherwise would be carried over the neutral current path. In one example, the selectable low-ohmic path 106 may include a low-ohmic switch component that is selectable by way of a control signal sourced by the control circuit 104. In other examples, the selectable low-ohmic path 106 may be configured instead to provide an additional current path coupling the line live connection 120 and the load live connection 130, as indicated in FIG. 1.

In addition to controlling the state of the selectable low-ohmic path 106, the control circuit 104 may be configured detect the difference in current (if any) over the live current path and the neutral current path via the differential current detector 102. In one example of miswire detection, while the electrical safety device 100 is coupled to an AC supply voltage, but no load is applied to the electrical safety device 100, the control circuit 104 may select or activate the low-ohmic path 106, and during the time that the low-ohmic path 106 is selected or activated, may detect whether a difference in currents carried over the live current path and the neutral current path exists or exceeds some threshold value. As is described in greater detail below with respect to the embodiments of FIGS. 2A through 2D, the absence of a difference in current may be indicative of a miswire condition, in which the AC supply voltage is applied across the load live connection 130 and the load neutral connection 132, instead of the line live connection 120 and the line neutral connection 122. Moreover, if a load, such as an electrical device that consumes power, is coupled to the electrical safety device 100 by at least one of the line connection pair 120, 122, the load connection pair 130, 132, or the receptacle connection pair 140, 142, the control circuit 104 may detect a polarity of the difference in currents carried over the live current path and the neutral current path and determine whether the electrical safety device 100 has been miswired based on that polarity.

Additionally, if the control circuit 104 determines that the electrical safety device 100 has indeed been miswired, the control circuit 104 may interrupt or disconnect the power of the AC power supply from the one or more loads that may be coupled to the electrical safety device 100, such as in the manner normally done when other types of circuit problems, such as ground faults or arc faults, are detected. For example, the control circuit 104 may activate a silicon-controlled rectifier (SCR) that energizes a solenoid to open one or more switches in the live current path and/or the neutral current path (not explicitly shown in FIG. 1), thus facilitating the disconnection. In many examples, such a connection may only be restored by way of remedying the problem (in this case, correcting the miswiring of the electrical safety device 100) and resetting the switches (such as by way of a user-operable reset button provided on the electrical safety device 100). In addition, the control circuit 104, in response to detecting the miswire condition, may employ an audio generation device (e.g., a speaker) to provide an audio indication of the condition, a light generation device (e.g., a light-emitting diode (LED)) to provide a visual indication of the condition, and/or a communication interface to provide a message notification over a communication network of the condition.

To detect a difference in current via the differential current detector 102, a load may be applied internally to the electrical safety device 100 to compensate for the lack of a load applied externally to the electrical safety device 100, typically by way of the load connection pair 130, 132 or the receptacle connection pair 140, 142. In some examples, the control circuit 104 may draw enough current from the AC power supply voltage applied to the electrical safety device 100, such as, for example, by way of an alternating-current-to-direct-current (AC-to-DC) converter (not explicitly shown in FIG. 1) located on the load side of the differential current detector 102 to serve as such a load. In other examples, the electrical safety device 100 may include a selectable load 108 located on the load side of the differential current detector 102 and controlled by the control circuit 104, as shown in FIG. 1, such that the control circuit 104 may apply the selectable load 108 across a point on the live current path and a point on the neutral current path. In one implementation, the control circuit 104 may employ the same control signal to select or activate both the selectable low-ohmic path 106 and the selectable load 108 to perform miswire detection.

In some examples, the control circuit 104 may include, or be coupled with, one or more analog components (e.g., resistors, capacitors, inductors, and/or the like) to detect and/or control the various components described above. Also, the control circuit 104 may include, or be coupled with, one or more digital components (e.g., logic gates, counter integrated circuits (ICs), data latches and/or buffers, and so on) to perform one of more of the tasks with which the control circuit 104 is tasked. In some embodiments, the control circuit 104 may include a microcontroller or other algorithmic processor that may execute instructions stored in a data memory to perform one or more tasks or operations of the control circuit 104 described herein.

FIGS. 2A through 2D are block diagrams of an example GFCI 200 in various states of correct and incorrect connection with an AC power supply 250 and a load 260. In this example, the AC power supply 250 may be 110 volts AC (VAC), although other AC voltages may be provided by the AC power supply 250 in other embodiments. The GFCI 200, as shown in these drawings, may include a current transformer (CT) 202 serving as the differential current detector 102 of FIG. 1, a switch 206 operating as the low-ohmic path 106 of FIG. 1, a control circuit 204 operating in a manner similar to that of the control circuit 104 of FIG. 1, and possibly a selectable load 208 coupled on the load side of the current transformer 202 in a manner similar to that of the selectable load 108 of FIG. 1. Further, while the switch 206 couples the line neutral connection 122 to the load neutral connection 132, the switch 206 may instead couple the line live connection 120 to the load live connection 130 while circumventing the current transformer 202, as described above in conjunction with the selectable low-ohmic path 106 of FIG. 1, in other embodiments.

In general, the current transformer 202 includes a magnetic core, through which a line current path coupling the line live connection 120 to the load live connection 130 and a neutral current path coupling the line neutral connection 122 and the load neutral connection 132 are routed to serve collectively as a primary circuit for the current transformer 202. The secondary circuit of the current transformer 202 may be in the form of a conductor wrapped a number of turns about the core and coupled to the control circuit 204. The difference in currents carried over the live current path and the neutral current path creates a magnetic flux in the core, which in turn induces a current in the secondary circuit, with the number of turns of the wrapping conductor determining the amount of current carried in the secondary circuit, thus providing an indication of the difference in currents carried over the line current path and the load current path to the control circuit 204 as a sense signal.

Additionally, the GFCI 200 may include a user-operable reset button 210 coupled to a set of switches 212 to reconnect the load connection pair 130, 132 and the receptacle connection pair 140, 142 to the line connection pair 120, 122 to allow current to flow through the GFCI 200 after a ground fault or a miswire configuration has been detected. In some examples, the GFCI 200 may also include a test button (not depicted in FIGS. 2A through 2D) that forces the switches 212 into an open state as if a circuit problem had been detected.

Figure 2A:
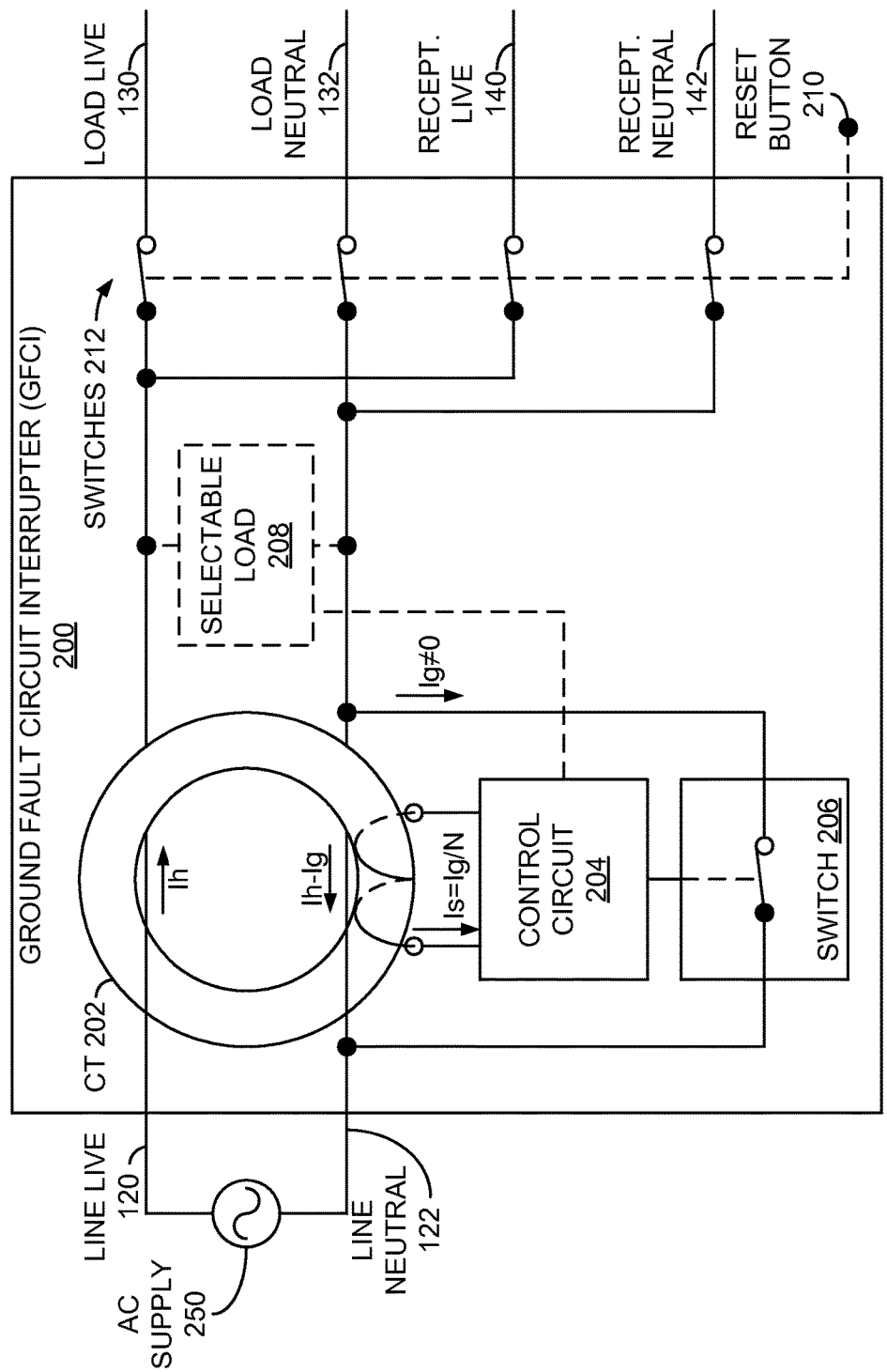
FIG. 2A is a block diagram of an example GFCI that is wired correctly and is not coupled with a load.

FIG. 2A is a block diagram of the GFCI 200 being wired correctly to the AC supply 250 and not being coupled with a load. More specifically, the AC supply 250 is coupled to the line connection pair 120, 122, and nothing is coupled to the load connection pair 130, 132 or the receptacle connection pair 140, 142. In this example, when the control circuit 204 has selected or activated the switch 206 (as well as possibly the selectable load 208), some of the current normally carried on the return current path is carried through the switch 206, resulting in a current $I_h$ on the live current path, a current $I_g$ through the switch 206, and a current $I_h-I_g$ on the return current path. Given that the currents on the live current path and the neutral current path are oppositely directed, the overall current through the magnetic core of the current transformer 202 is the difference between the two currents, or $I_g$. The difference current induces a sense current or signal in the secondary circuit of $I_s=I_g/N$, wherein N is the number of turns of the secondary conductor about the core of the current transformer 202. Accordingly, the control circuit 204, having detected a difference current, or having detected a difference current above some threshold value by way of a comparison circuit, may conclude that the GFCI 200 is wired correctly and may thus allow the GFCI to couple the AC supply 250 to the load connection pair 130, 132 and the receptacle connection pair 140, 142. Further, under normal operating conditions (e.g., while the switch 206 is in the open state), the control circuit 204 may monitor the difference current and open one or more of the switches 212 in response to a detected difference current that exceeds some threshold while a load is coupled to either the load connection pair 130, 132 and/or the receptacle connection pair 140, 142, thus indicating a ground fault condition.

Figure 2B:
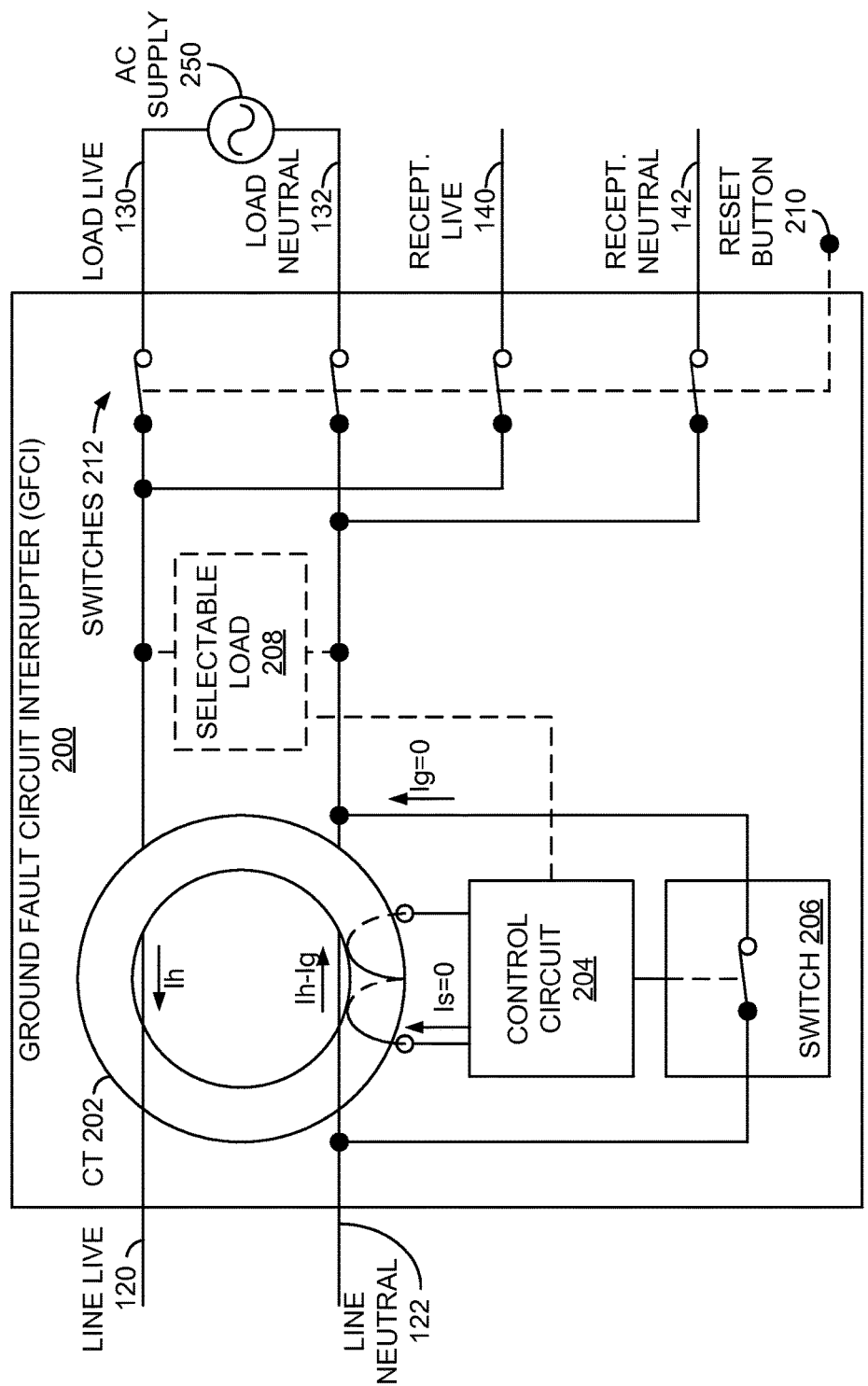
FIG. 2B is a block diagram of the example GFCI of FIG. 2A that is miswired and is not coupled with a load.

FIG. 2B is a block diagram of the GFCI 200 while the GFCI 200 is miswired to the AC supply 250 and is not coupled with a load. More specifically, the AC supply 250 is coupled to the load connection pair 130, 132 by mistake. In this case, if a load is subsequently coupled to the line connection pair 120, 122, under normal ground fault detection operations of the GFCI 200 (e.g., when the switch 206 is open), the control circuit 204 will still be able to detect a ground fault at the line connection pair 120, 122, as any current that flows between the AC supply 250 and the load at the line connection pair 120, 122 will still be routed through the current transformer 202, so that any difference in currents carried over the live current path and the neutral current path will be detectable at the control circuit 204.

However, if a load is only coupled at the receptacle connection pair 140, 142 and no load is coupled to the line connection pair 120, 122 during normal ground fault detection operations, current will flow between the AC supply 250 at the load connection pair 130, 132 and the load at the receptacle connection pair 140, 142, thus not passing through the current transformer 202 since no current path exists via the line connection pair 120, 122 on the line side of the current transformer 202. Accordingly, if a ground fault occurs at the load at the receptacle connection pair 140, 142, the control circuit 204 will not be able to detect that fault.

To address this scenario, the control circuit 204 may detect such a miswired configuration by way of the switch 206 while the line connection pair 120, 122 remains unconnected. More specifically, when the control circuit 204 activates or closes the switch 206 (and possibly activates the selectable load 208, if present), no current will be available to be directed through the switch 206 and thus to be circumvented around the current transformer 202, resulting in a current $I_g$ through the switch 206 of substantially zero, resulting in a differential current of substantially zero through the current transformer 202 regardless of whether a load is coupled across the receptacle connection pair 140, 142. The control circuit 204 may be configured to interpret this lack of differential current as a miswiring of the GFCI 200, and to open at least one of the switches 212 to the prevent use of the GFCI 200 while the miswire condition persists.

Presuming the miswire detection operations of the GFCI 200 are executed when no external loads are connected to the GFCI 200, as described above, or are connected only to the receptacle connection pair 140, 142, the detection of a substantially zero differential current may be sufficient to detect a miswire configuration, such as during power-up of the GFCI 200 via the AC supply 250. In other examples in which a load may be applied incorrectly to the line connection pair 120, 122, consideration in the control circuit 204 of the polarity of any differential current detected may allow repeated or periodic testing of a miswire configuration after power-up. In some examples, periodic miswire testing may be performed once every 15 minutes, but other longer or shorter time periods may be employed in other implementations. In yet other embodiments, the miswire detection operations may be initiated in response to a user activating the test button mentioned above.

Figure 2C:
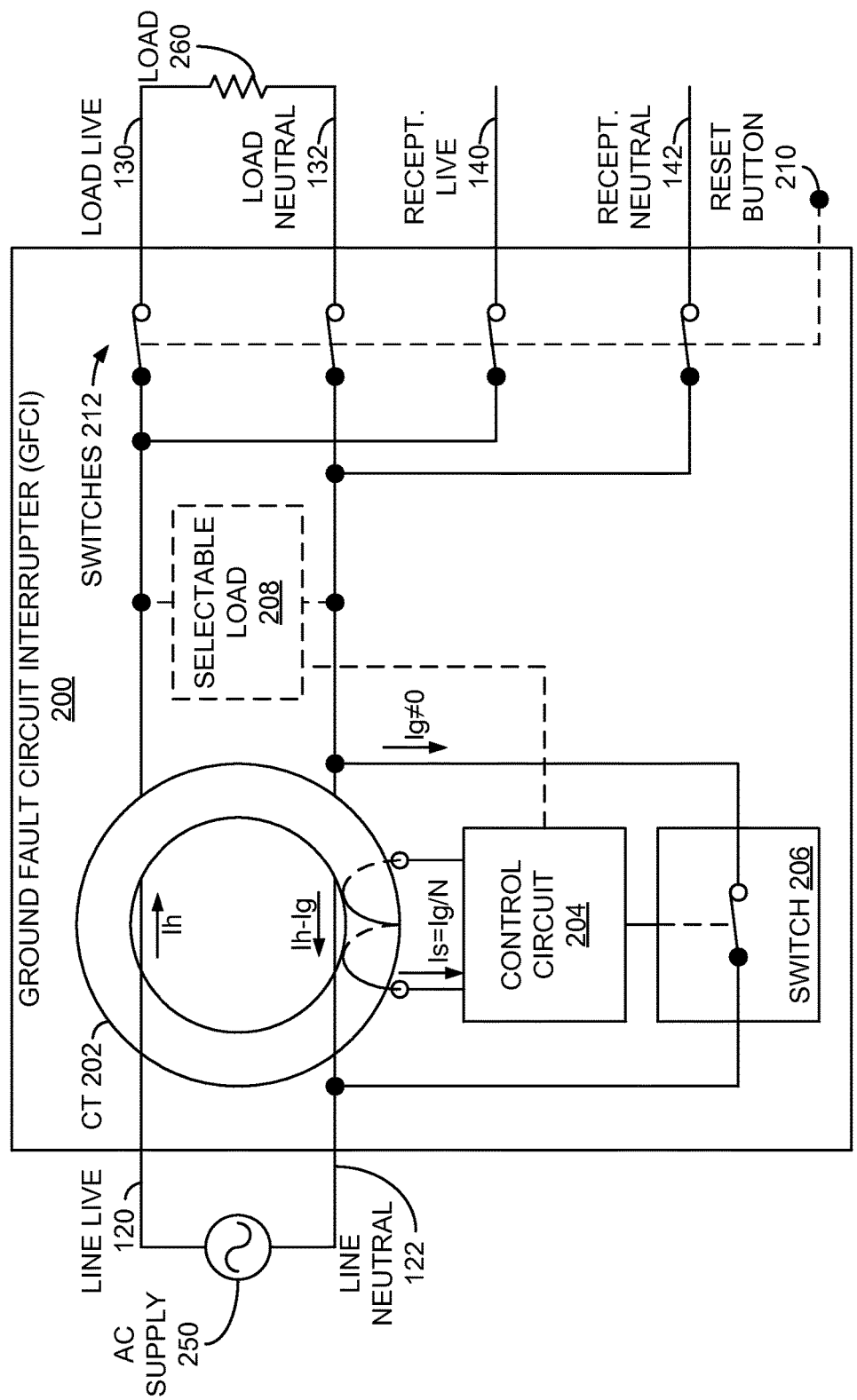
FIG. 2C is a block diagram of the example GFCI of FIG. 2A that is wired correctly and is coupled with a load.

For example, FIG. 2C is a block diagram of the example GFCI 200 in an environment in which the AC supply 250 is wired correctly to the line connection pair 120, 122 while one or more loads are wired correctly to the GFCI 200 via the load connection pair 130, 132 and/or the receptacle connection pair 140, 142. When closing the switch 206, thus causing a non-zero current $I_g$ to flow through the switch 206, thus circumventing the current transformer 202, the control circuit 204 will detect a non-zero current $I_s = I_g/N$, and thus may deduce that the AC supply 250 is correctly wired to the line connection pair 120, 122 and allow the switches 212 to remain closed.

Figure 2D:
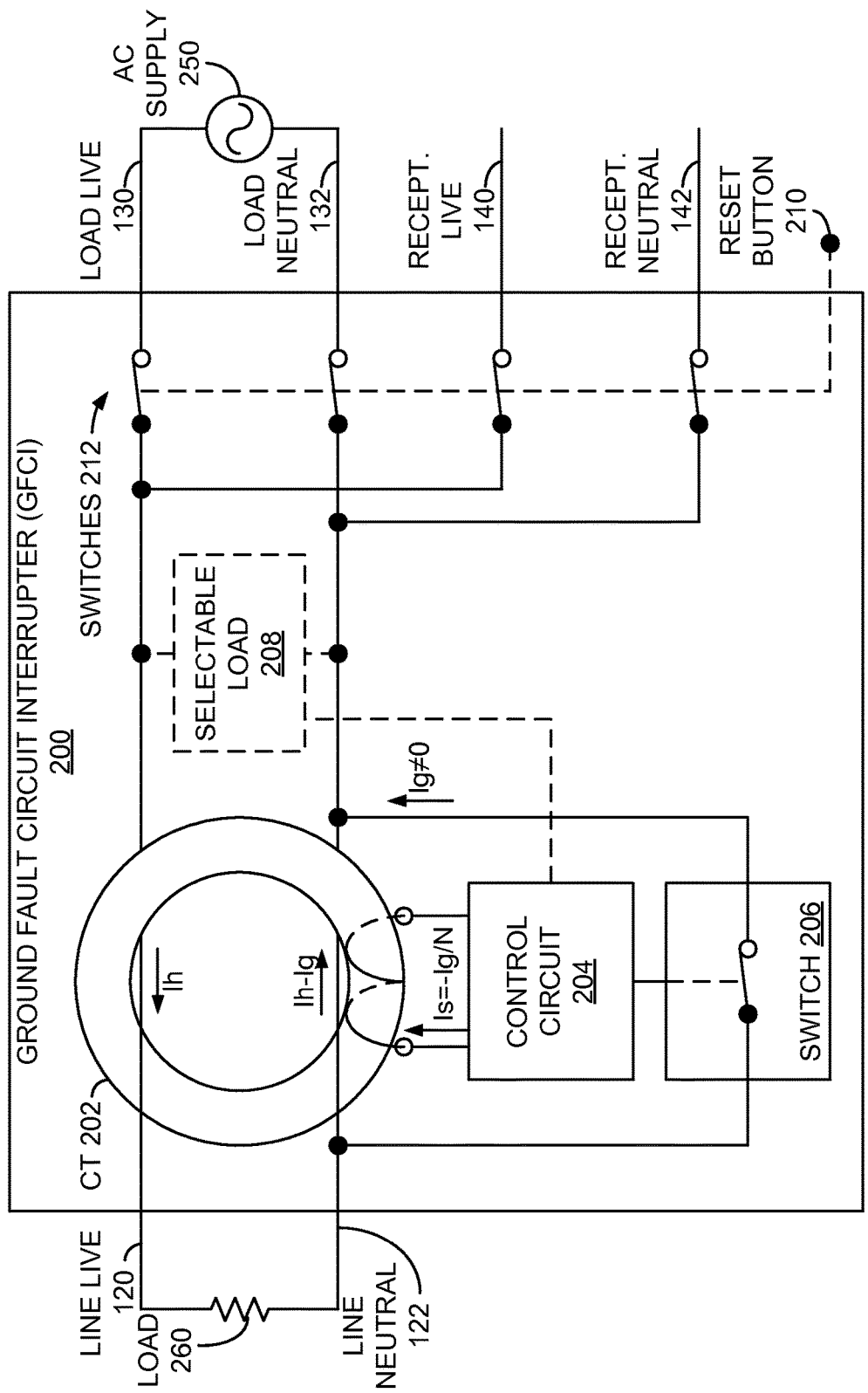
FIG. 2D is a block diagram of the example GFCI of FIG. 2A that is miswired and is coupled with a load.

However, as indicated above, the possible presence of a load during a miswire detection operation may involve consideration of the polarity of the differential current detected at the control circuit 204. For example, FIG. 2D is a block diagram of the GFCI 200 that is miswired (e.g., the AC supply 250 is connected to the load connection pair 130, 132) and the load 260 is connected to the line connection pair 120, 122. In addition, an additional load may or may not be connected to the receptacle connection pair 140, 142. Under such conditions, the control circuit 204, while activating or closing the switch 206, may detect a differential current $I_s = -I_g/N$ that exceeds some threshold value or level due to a non-zero current $I_g$ flowing through the switch 206 derived from current carried over the neutral current path between the load neutral connection 132 and the line neutral connection 122, thus falsely indicating a correctly wired GFCI 220. To address this possibility, the control circuit 204 may detect not only whether the differential current $I_s$ exists or exceeds some threshold, but may also determine the polarity of the differential current $I_s$ to determine whether the AC supply 250 is coupled to the line connection pair 120, 122 or the load connection pair 130, 132.

For example, the control circuit 204 may include a zero-cross-detect (ZCD) circuit (not explicitly depicted in FIG. 2D) that indicates when the positive or negative voltage portion of each cycle of the AC supply 250 voltage is occurring. Based on the information from the ZCD circuit and the detected differential current, including its polarity (e.g., a negative or positive current), the control circuit 204 may determine whether the AC supply 250 is connected correctly to the GFCI 200 (e.g., to the line connection pair 120, 122). More specifically, if the control circuit 204 does not detect a differential current $I_s$ with a magnitude that exceeds a particular threshold value during a known portion of the power cycle (e.g., while the voltage of the AC supply 250 is either positive or negative) while the switch 206 is closed, the control circuit 204 may determine that the AC supply 250 is miswired (e.g., connected to the load connection pair 130, 132). If, instead, the control circuit 204 detects a magnitude of the differential current $I_s$ exceeding a threshold value, but detects a polarity of the differential current $I_s$ (e.g., a negative differential current $I_s$) that is the opposite of what may be expected (e.g., a positive differential current $I_s$) for the particular portion of the AC supply 250 voltage (e.g., the positive half-cycle of the voltage) generating the differential current $I_s$ when the AC supply 250 is correctly connected to the line connection pair 120, 122, the control circuit 204 may then determine that a miswire condition has been detected, and then open one or more of the switches 212 accordingly.

In some examples, the control circuit 204 may activate or close the switch 206, as well as the selectable load 208, during a particular portion of the voltage cycle of the AC supply 250, such as when the voltage is only positive or only negative. In addition, in some embodiments, the control circuit 204 may dynamically alter the amount of time the switch 206 is closed and the selectable load 208 is selected based on the detected differential current $I_s$. For example, the control circuit 204 may allow the switch 206 closed (and possibly the selectable load 208 to remain applied or selected) until the detected differential current $I_s$ attains the threshold at which the control circuit 204 determines that a miswire configuration has been detected, or some higher threshold level. In the case of a high load current (e.g., a low resistance load), for example, the detected differential current $I_s$ may attain the threshold level more quickly than in the case of a low load current (e.g., a high resistance load), and thus the switch 206 may be closed for a relatively shorter time period. Further, in the case of the detected differential current $I_s$ not attaining the threshold, the control circuit 204 may await until the ZCD circuit determines that the current (positive or negative) half-cycle of the voltage of the AC supply 250 is over before opening the switch 206, as well as deselecting the selectable load 208. Operating the switch 206, and possibly the selectable load 208, in such a manner may help buildup of excessive current due to the inductance of the current transformer 202 that may otherwise occur if the switch 206 were always closed during the entire half-cycle of the AC supply 250 voltage. This excessive current may lead either to nuisance tripping of the GFCI 200 when an actual ground fault condition has not been encountered, or to a delayed response of the GFCI 200 in the presence of an actual ground fault event.

FIG. 3 is an example circuit of a switch 206 employable as a selectable low-ohmic path in the GFCI 200. In this particular example, a low-ohmic metal-oxide-semiconductor field-effect transistor (MOSFET) may be employed as a transistor Q1 to facilitate the switching functionality. An example of such a MOSFET is the NTMFS4935NT1G n-channel Power MOSFET by ON Semiconductor® with an "on" drain-to-source resistance of 3.2 milliohms (mΩ) and a drain-to-source breakdown voltage of 30 volts (V). However, other types of low-ohmic transistors that are comparable or approximately equal to the resistance of the current live and neutral paths of the GFCI 200 (e.g., FETs and/or other transistors with an "on" resistance of 10 mΩ or less) may be employed in other examples. As shown in FIG. 3, the switch 206 may also include a resistor R1 of an appropriate value to apply at least a gate-to-source threshold voltage to turn on the transistor Q1. In one example, the resistor R1 may have a value of 50Ω, although other values may be employed in other implementations. The switch 206 may also include a rectifier D1, such as an MRA4007 by ON Semiconductor® in one example, driving the gate of the transistor Q1 via a signal from the control circuit 204, which may serve to protect the control circuit 204 from potentially damaging current from the switch 206. However, many other configurations and components other than that shown in FIG. 3 may be employed for the switch 206 in other embodiments.

Figure 4:
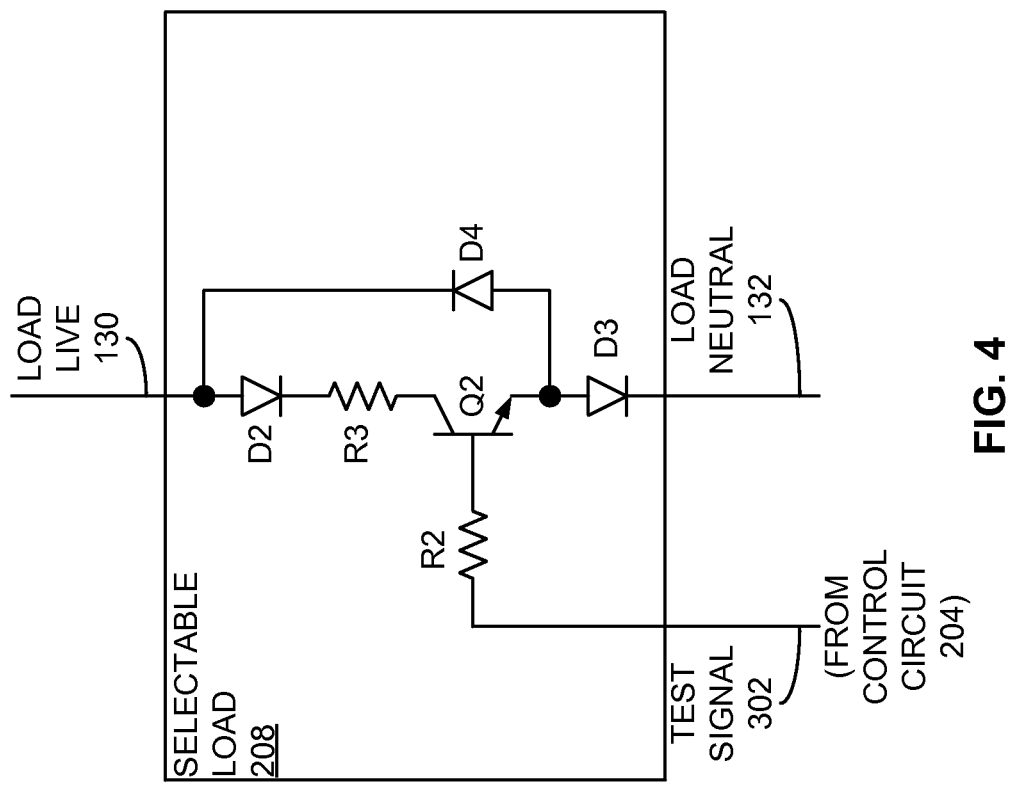
FIG. 4 is an example selectable load employable as the selectable load in the GFCI of FIGS. 2A through 2D.

FIG. 4 is an example selectable load 208 employable in the GFCI 200. As shown, a control signal from the control circuit 204 (such as, for example, the same control signal used to activate the switch 206) may be used to turn on a transistor Q2 using a resistor R2 to generate a positive bias voltage across the base-to-emitter junction of the transistor Q2 to turn on the transistor Q2. In one example, the transistor Q2 may be a MMBT6517LT1-D high-voltage NPN bipolar-junction transistor (BJT) by ON Semiconductor®, although other transistors may be employed as the transistor Q2 in other embodiments. A resistor R3 may provide the desired amount of resistance to be used as the load to be applied across the live and neutral current paths. Further, diodes D2 and/or D3 may be utilized to allow current to flow only from collector to emitter of the transistor Q1, while another diode D4 may help protect the transistor Q2 against large negative voltages at the output of transistor Q1. In the particular configuration, the selectable load 208 is intended to be applied as a load during positive half-cycles of the voltage of the AC supply 250. However, many other configurations and components other than that shown in FIG. 4 may be employed for the selectable load 208 in other embodiments, such as those intended to operate during the negative half-cycle of the AC supply 250 voltage.

Figure 5:
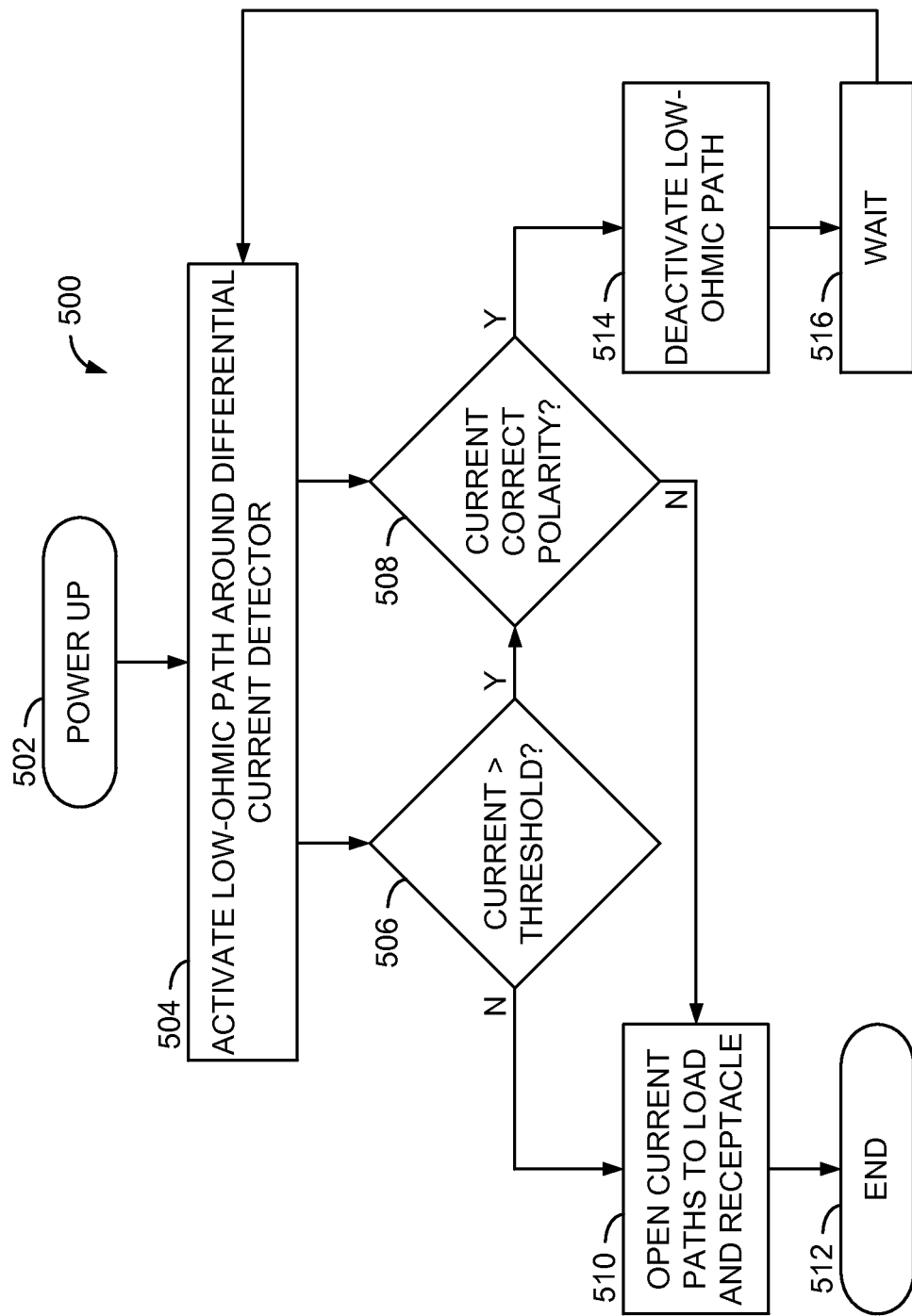
FIG. 5 is a flow diagram of an example method of detecting a miswiring of an electrical safety device.

FIG. 5 is a flow diagram of an example method 500 of detecting a miswiring of an electrical safety device, such as by way of the electrical safety device 100 of FIG. 1 or the GFCI 200 of FIGS. 2A through 2D. However, other systems or devices not specifically described herein may perform the method 500 in other embodiments.

In the method 500, in response to power-up (operation 502) of the GFCI 200 due to application of the AC supply 250, a control circuit (e.g., the control circuit 104 of FIG. 1) may activate or close a low-ohmic path (e.g., the low-ohmic path 106 around the differential current detector 102) (operation 504). To ensure enough load current is provided, the control circuit may also select a selectable load (e.g., the selectable load 108 of FIG. 1) to be applied across points of the live and neutral current paths of the electrical safety device. While the low-ohmic path is activated, the control circuit may determine whether a differential current routed through a differential current detector (e.g., the differential current detector 102 of FIG. 1) exceeds some particular threshold (operation 506), such as, for example, 40 milliamps (mA). If the threshold is not exceeded, the control circuit may determine that a miswire condition has been detected, and open one or more of the live and neutral current paths to the load and/or receptacle connections (e.g., the load connection pair 130, 132 and/or the receptacle connection pair 140, 142 of FIG. 1) of the electrical safety device (operation 510) and cease operation (operation 512) until the miswire condition has been remedied. If, instead, the detected differential current exceeds the threshold (operation 506), the control circuit may determine whether the detected differential current has a polarity corresponding to a correctly-wired AC supply (operation 508). If so, the control circuit may deactivate the low-ohmic path (as well as the selectable load) (operation 514) and wait for some predetermined period of time (operation 516) before performing another miswire detection operation. If, instead, the detected differential current has a polarity corresponding to an incorrectly wired AC supply (operation 508), the control circuit may open one or more of the current paths to the load and/or receptacle connections (operation 510) and cease further miswire detection operations (operation 512) until the electrical safety device is wired correctly.

While the operations 502-516 are depicted as operations performed in a particular sequence, at least some of the operations 502-516 of FIG. 5 may be performed in other orders of execution, including in a parallel, overlapping, or concurrent manner. For example, the threshold detection operation (operation 506) and the polarity determination operation (operation 508) may be performed simultaneously or in a different order from that indicated in FIG. 5.

In examples in which the electrical safety device 100 is a GFCI, such as the GFCI 200 of FIGS. 2A through 2D, employment of various aspects of the embodiments described herein may adhere to, and possibly surpass, the demands of the 2015 revisions of the Underwriters Laboratories (UL®) standard UL943 for GFCIs that mandate auto-monitoring or self-test functionality of its ground fault detection capabilities, as well as line-load miswire detection, such as that described above.

While the particular embodiments described herein involve AC currents and voltages, electrical safety devices for a DC-based electrical power system may benefit from application of one or more of the various aspects of these embodiments.

As used herein, the term "or" may be construed in either an inclusive or exclusive sense. Moreover, plural instances may be provided for resources, operations, or structures described herein as a single instance. Additionally, boundaries between various resources and operations may be arbitrary, and particular operations are illustrated in a context of specific illustrative configurations. In general, structures and functionality presented as separate resources in the example configurations may be implemented as a combined structure or resource. Similarly, structures and functionality presented as a single resource may be implemented as separate resources.

While the present disclosure has been described with reference to various embodiments, these embodiments are illustrative, and the scope of the disclosure is not limited to such embodiments. Various modifications and additions can be made to the exemplary embodiments discussed herein without departing from the scope of the disclosure. For example, while the embodiments described above refer to particular features, the scope of this disclosure also includes embodiments having different combinations of features, as well as embodiments that do not include all of the described features. Accordingly, the scope of the disclosure is intended to embrace all such alternatives, modifications, and variations, together with all equivalents thereof.

The invention claimed is:
1. An electrical safety device comprising:
a line connection input, the line connection input including a line live input and a line neutral input configured to receive an a.c. signal;
a differential current detector to be coupled with a control circuit configured to receive a sense signal from the differential current detector indicating an amount of current passing through the differential current detector on a live current path and a neutral current path;
the control circuit configured to form a test signal;
an interrupter output; and
circuitry to:
activate the test signal to cause at least a portion of the current passing through the differential current detector on one of the live current path and the neutral current path to circumvent the differential current detector;

compare, while the test signal is active, the sense signal to a threshold value;

activate the interrupter output in response to the sense signal not exceeding the threshold value to cause at least one of the live current path and the neutral current path to be interrupted;

determine a polarity of the sense signal in response to the sense signal exceeding the threshold value; and activate the interrupter output in response to the sense signal having a polarity that is opposite to a polarity of the a.c. signal.

2. The control circuit of claim 1, further comprising:
the control circuit configured to detect zero voltage crossings of an alternating current (AC) voltage across a point along the live current path and a point along the live neutral path;

wherein the circuitry is to:
activate the test signal in response to a first zero voltage crossing that corresponds with a first polarity of the AC voltage; and deactivate the test signal in response to the sense signal exceeding the threshold value or a second zero voltage crossing that immediately follows the first zero voltage crossing.

3. The control circuit of claim 1, wherein the circuitry is further to activate the test signal and compare the sense signal to the threshold value in response to a power supply voltage being supplied to the control circuit.

4. The control circuit of claim 1, wherein the circuitry is further to activate the test signal and compare the sense signal to the threshold value periodically while a power supply voltage is supplied to the control circuit.

5. An electrical safety device comprising:
a live current path coupling a line live connection and a load live connection;
a neutral current path coupling a line neutral connection and a load neutral connection;
the line live and line neutral connections configured to receive an a.c. signal:
a differential current detector through which the live current path and the neutral current path are routed;
a selectable conducting path that, when selected, circumvents the differential current detector while shorting one of the line live connection to the load live connection or shorting the line neutral connection to the load neutral connection; and
a control circuit to:
select the selectable conducting path;
determine, via the differential current detector, while the selectable conducting path is selected, a differential current defined by a difference between a first current on the live current path and a second current on the neutral current path;
interrupt at least one of the live current path and the neutral current path in response to the differential current not exceeding a threshold value;
determine a polarity of the differential current in response to the differential current exceeding the threshold value; and
interrupt the at least one of the live current path and the neutral current path based on the polarity of the differential current being opposite of a polarity of the a.c. signal.

6. The electrical safety device of claim 5,
wherein the control circuit is further to indicate the differential current not exceeding the threshold value.

7. The electrical safety device of claim 5, the selectable conducting path comprising a field effect transistor (FET) having a resistance in an on state that is approximately equal to a resistance of at least one of the live current path and the neutral current path.

8. The electrical safety device of claim 5, wherein the control circuit is further to provide a selectable electrical load selectable to be coupled across the live current path and the neutral current path.

9. An electrical safety device comprising:
a live current path coupling a line live connection and a load live connection;
a neutral current path coupling a line neutral connection and a load neutral connection;
a load circuit coupled between the live current path and the neutral current path to provide an electrical load in response to a first control signal;
the line live and line neutral connections configured to receive an a.c. signal;
a differential current detector through which the live current path and the neutral current path are routed;
a selectable conducting path that, when selected, circumvents the differential current detector while shorting one of the line live connection to the load live connection or shorting the line neutral connection to the load neutral connection; and
a control circuit to:
select the selectable conducting path;
determine, via the differential current detector, while the selectable conducting path is selected, a differential current defined by a difference between a first current on the live current path and a second current on the neutral current path;
interrupt at least one of the live current path and the neutral current path in response to the differential current not exceeding a threshold value;
determine a polarity of the differential current in response to the differential current exceeding the threshold value; and
interrupt the at least one of the live current path and the neutral current path based on the polarity of the differential current being opposite of a polarity of the a.c. signal;
wherein the control circuit is to provide the first control signal to the load circuit while the selectable conducting path couples one of the line live connection to the load live connection or the line neutral connection to the load neutral connection.

10. The electrical safety device of claim 5, further comprising:
a receptacle live connection connected to the load live connection via a first current path that is not routed through the differential current detector; and
a receptacle neutral connection connected to the load neutral connection via a second current path that is not routed through the differential current detector.

11. The electrical safety device of claim 5, wherein the control circuit is configured to detect zero crossings of an AC voltage across a point along the live current path and a point along the neutral current path, and wherein the control circuit is further to:
select the selectable conducting path in response to a first detected zero crossing of the AC voltage that corresponds with a first polarity of the AC voltage; and deselect the conducting path in response to the differential current exceeding the threshold value or a second detected zero crossing of the AC voltage that immediately follows the first detected zero crossing.

12. The electrical safety device of claim 5, wherein the control circuit is further to select the selectable conducting path and determine the differential current in response to a power supply voltage being applied to the control circuit.

13. The electrical safety device of claim 5, wherein the control circuit is further to select the selectable conducting path and determine the differential current periodically while a power supply voltage is applied to the control circuit.

14. The electrical safety device of claim 5, wherein the electrical safety device comprises at least one of a ground fault circuit interrupter, an arc fault circuit interrupter, a surge protection device, or a transient voltage surge suppressor.

15. The electrical safety device of claim 5, wherein the control circuit comprises:
   a differential current detector input to be coupled with the differential current detector to receive a sense signal indicating the differential current;
   an output for forming a test signal to select the selectable conducting path;
   the control circuit configured to compare the sense signal to a threshold while the test signal is active; and
   an interrupter output to cause at least one of the live current path and the neutral current path to be interrupted in response to the sense signal not exceeding the threshold.

16. A method for detecting a miswiring of a line connection pair and a load connection pair of an electrical safety device, the method comprising:
   configuring a control circuit to circumvent at least a portion of an electrical current carried over one of a live current path and a neutral current path through the electrical safety device, the live current path connecting a line live connection of the line connection pair with a load live connection of the load connection pair, and the neutral current path connecting a line neutral connection of the line connection pair with a load neutral connection of the load connection pair wherein the line live connection and the line neutral connection are configured to be coupled to receive an a.c. signal;
   configuring the control circuit to determine, while circumventing the at least a portion of the electrical current, a differential current defined by a difference between the electrical current carried over the live current path and the electrical current carried over the neutral current path;
   configuring the control circuit to interrupt at least one of the live current path and the neutral current path in response to the differential current not exceeding a threshold value;
   configuring the control circuit to determine a polarity of the differential current in response to the differential current exceeding the threshold value; and
   configuring the control circuit to interrupt the at least one of the live current path and the neutral current path in response to the polarity of the differential current being opposite to a polarity of the a.c. signal.

17. The control circuit of claim 1 wherein activating the control signal either shorts the line live connection to the load live connection or shorts the line neutral connection to the load neutral connection.

18. The control circuit of claim 1 wherein activating the control signal closes a switch to cause a short across the differential current detector either from the line live input to the load live output prior to the interrupter output or from the line neutral input to the load neutral output prior to the interrupter output.

* * * * *